(12) United States Patent
Maeda et al.

(10) Patent No.: US 10,257,927 B2
(45) Date of Patent: Apr. 9, 2019

(54) MOTHER CERAMIC SUBSTRATE, CERAMIC SUBSTRATE, MOTHER MODULE COMPONENT, MODULE COMPONENT, AND METHOD OF MANUFACTURING MOTHER CERAMIC SUBSTRATE

(71) Applicant: MURATA MANUFACTURING CO., LTD., Kyoto (JP)

(72) Inventors: Yukio Maeda, Kyoto (JP); Masashi Matsubara, Kyoto (JP); Daigo Matsubara, Kyoto (JP); Masatoshi Kariya, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 17 days.

(21) Appl. No.: 15/358,241

(22) Filed: Nov. 22, 2016

(65) Prior Publication Data

US 2017/0079137 A1 Mar. 16, 2017

Related U.S. Application Data

(63) Continuation of application No. PCT/JP2015/058859, filed on Mar. 24, 2015.

(30) Foreign Application Priority Data

May 27, 2014 (JP) ................................. 2014-109395

(51) Int. Cl.
  *H05K 7/00* (2006.01)
  *H05K 1/03* (2006.01)
  (Continued)

(52) U.S. Cl.
  CPC ............. *H05K 1/0306* (2013.01); *H05K 1/14* (2013.01); *H05K 3/0052* (2013.01);
  (Continued)

(58) Field of Classification Search
  CPC ........ H05K 1/0306; H05K 1/14; H05K 1/181; H05K 2201/04; H05K 2201/09063;
  (Continued)

(56) References Cited

U.S. PATENT DOCUMENTS

2005/0029463 A1* 2/2005 Kaemmerer ......... H05K 1/0271
                                                              250/370.01
2008/0128157 A1* 6/2008 Murata ............... H01L 21/4807
                                                              174/250
(Continued)

FOREIGN PATENT DOCUMENTS

JP  2001-338832 A  12/2001
JP  2005-015293 A   1/2005
(Continued)

OTHER PUBLICATIONS

International Search Report Issued in Patent Application No. PCT/JP2015/058859 dated Jun. 9, 2015.
(Continued)

*Primary Examiner* — Yuriy Semenenko
(74) *Attorney, Agent, or Firm* — Pearne & Gordon LLP

(57) ABSTRACT

Provided is a mother ceramic substrate that, when divided into individual substrates (ceramic substrates), can be divided to cause divided end surfaces to be perpendicular to principal surfaces of the individual substrates, and that can provide ceramic substrates with high form accuracy; an individual ceramic substrate obtained from the mother ceramic substrate; a module component including the ceramic substrate; and a method of manufacturing a mother ceramic substrate. In a mother ceramic substrate that can be divided at a predetermined position and separated into a plurality of individual substrates, a dividing groove that defines a division position is formed in a principal surface on one side, and a protruding thread is formed on a principal surface on another side at a position corresponding to a
(Continued)

position of the dividing groove formed in the principal surface on the one side in view in a thickness direction of the mother ceramic substrate.

16 Claims, 20 Drawing Sheets

(51) Int. Cl.
*H05K 1/14* (2006.01)
*H05K 3/00* (2006.01)
*H05K 3/22* (2006.01)
*H05K 1/18* (2006.01)
*H05K 3/46* (2006.01)

(52) U.S. Cl.
CPC ............ *H05K 3/0097* (2013.01); *H05K 3/22* (2013.01); *H05K 1/181* (2013.01); *H05K 3/0014* (2013.01); *H05K 3/4629* (2013.01); *H05K 2201/04* (2013.01); *H05K 2201/0909* (2013.01); *H05K 2201/09063* (2013.01); *H05K 2201/09127* (2013.01); *H05K 2203/0108* (2013.01); *H05K 2203/0113* (2013.01); *H05K 2203/1126* (2013.01)

(58) Field of Classification Search
CPC . H05K 2201/0909; H05K 2201/09127; H05K 2203/0108; H05K 2203/0113; H05K 2203/1126; H05K 3/0014; H05K 3/0052; H05K 3/0097

See application file for complete search history.

(56) References Cited

U.S. PATENT DOCUMENTS

| | | | |
|---|---|---|---|
| 2008/0308976 A1* | 12/2008 | Ito | B32B 18/00 264/642 |
| 2011/0177292 A1* | 7/2011 | Teshima | H01L 21/481 428/156 |
| 2015/0026972 A1* | 1/2015 | Ogawa | H05K 3/0052 29/832 |

FOREIGN PATENT DOCUMENTS

| | | | |
|---|---|---|---|
| JP | 2006-303056 A | | 11/2006 |
| JP | 2006-324617 A | | 11/2006 |
| JP | 2007-095973 A | | 4/2007 |
| JP | 2007-165540 A | | 6/2007 |
| JP | 2011-071374 A | | 4/2011 |
| JP | 2011071374 | * | 4/2011 |
| JP | 2014-011421 A | | 1/2014 |

OTHER PUBLICATIONS

Written Opinion Issued in Patent Application No. PCT/JP2015/058859 dated Jun. 9, 2015.

* cited by examiner

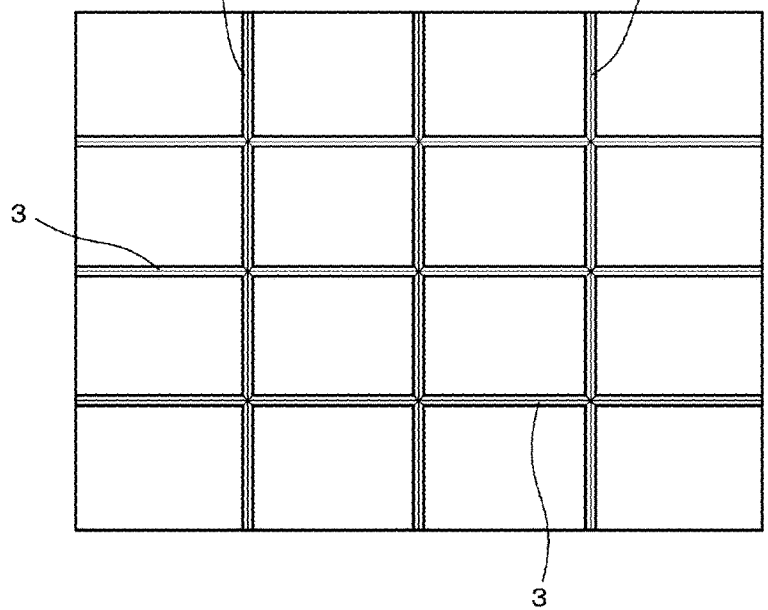

PRIOR ART

MOTHER CERAMIC SUBSTRATE, CERAMIC SUBSTRATE, MOTHER MODULE COMPONENT, MODULE COMPONENT, AND METHOD OF MANUFACTURING MOTHER CERAMIC SUBSTRATE

This is a continuation of International Application No. PCT/JP2015/058859 filed on Mar. 24, 2015 which claims priority from Japanese Patent Application No. 2014-109395 filed on May 27, 2014. The contents of these applications are incorporated herein by reference in their entireties.

FIELD OF THE DISCLOSURE

The present disclosure relates to a mother ceramic substrate that can be divided at a predetermined position and separated into a plurality of individual substrates, a ceramic substrate obtained by dividing the mother ceramic substrate, a mother module component using the mother ceramic substrate, a module component obtained by dividing the mother module component, and a method of manufacturing a mother ceramic substrate.

DESCRIPTION OF THE RELATED ART

To manufacture a ceramic substrate, there has been widely used a method of dividing a fired mother ceramic substrate, and thus dividing the mother ceramic substrate into individual ceramic substrates.

As a method of dividing a fired mother ceramic substrate into individual ceramic substrates with a predetermined dimension, for example, Patent Document 1 describes a method of forming grooves in a grid pattern at division positions of a mother ceramic multilayer body by applying a pressure with use of a press plate having protruding portions, which are continuous in a grid pattern at the division positions, after firing, dividing the fired mother ceramic multilayer body along the grooves, and obtaining multilayer ceramic substrates.

Also, Patent Document 2 discloses a method of providing at least one continuous groove in a sintered ferrite substrate provided with an adhesive material layer on one surface, hence forming a sintered ferrite substrate that can be divided at the aforementioned continuous groove as the start point, and dividing the sintered ferrite substrate into individual ceramic substrates.

Further, Patent Document 3 discloses a method of manufacturing a multilayer ceramic substrate by arranging a green sheet for reducing shrink on each of both surfaces of a multilayer body including a plurality of green sheets for a substrate, using a green sheet for reducing shrink having a dividing groove forming pattern serving as a reference for formation positions of the dividing grooves in the surface as at least one of the green sheets for reducing shrink, forming dividing grooves for dividing the substrate in the surface of the multilayer body by using the dividing groove forming pattern of the green sheet for reducing shrink, firing the multilayer body, and dividing the multilayer body along the dividing grooves.

However, with the methods disclosed in Patent Documents 1 to 3, as shown in FIGS. 22A and 22B, dividing grooves 301 for break are formed in a surface 300a on one side of a mother substrate 300, and the mother substrate 300 is broken at the dividing grooves as the start point. Hence, the start point for break is present only in the surface on the one side of the mother substrate. Therefore, it is difficult to divide the mother substrate 300 so that divided end surfaces 302 are perpendicular to the surface 300a of the mother substrate 300 as intended. As schematically shown in FIG. 23, the divided end surfaces 302 may not be perpendicular to the principal surface but may be oblique to the principal surface.

As the result, the appearance and dimensions of individual ceramic substrates obtained by division may be defective. When the ceramic substrates each are, for example, a multilayer ceramic substrate having an inner electrode, a serious defect such as exposure of the inner electrode may occur.

Also, as the depth of the dividing grooves serving as the start point of break is smaller, oblique break more likely occurs. In contrast, if the depth of the dividing grooves is too large, a trouble such as unintentional break of the ceramic substrate at handling may occur.

Also, in recent years, multiple individual pieces obtained by dividing a plate-shaped ferrite sintered body (a ferrite sheet) in a mother ceramic substrate state have been used for an electromagnetic-wave blocking and absorbing member for blocking and absorbing an electromagnetic wave, or an antenna device of RFID or NFC. A holding sheet may be occasionally attached to either or both sides of such a ferrite sheet in case of necessity. A single holding sheet may be attached to a single individual piece, or a single holding sheet may be attached to a plurality of individual pieces.

To divide the above-described plate-shaped ferrite sintered body (the ferrite sheet) into multiple individual pieces, dividing grooves have been formed in one side of the ferrite sheet.

However, in recent years, reduction in thickness (for example, a thickness of 200 μm or smaller) has progressed for the ferrite sintered body (the ferrite sheet) used for such a purpose. Hence it has been difficult to form dividing grooves with a proper depth. If the depth of the dividing grooves is too large, the ferrite sheet may be divided before firing. If the depth is too small, the ferrite sheet may not be properly broken along the dividing grooves. For example, the ferrite sheet may be cracked into small pieces at break, and the characteristics may be degraded.

Patent Document 1: Japanese Unexamined Patent Application Publication No. 2001-338832

Patent Document 2: Japanese Unexamined Patent Application Publication No. 2005-15293

Patent Document 3: Japanese Unexamined Patent Application Publication No. 2007-165540

BRIEF SUMMARY OF THE DISCLOSURE

The present disclosure addresses the above-described problems, and an object of the present disclosure is to provide a mother ceramic substrate that, when divided into individual substrates (ceramic substrates), can be divided to cause divided end surfaces to be perpendicular to principal surfaces of the individual substrates, and that can provide ceramic substrates with high form accuracy; an individual ceramic substrate obtained by dividing the mother ceramic substrate; a mother module component using the mother ceramic substrate; and a method of manufacturing a mother ceramic substrate.

To address the above-described problems, a mother ceramic substrate according to the present disclosure can be divided at a predetermined position and separated into a plurality of individual substrates.

A dividing groove that defines a division position is formed in a principal surface on one side.

A protruding thread is formed on a principal surface on another side at a position corresponding to a position of the dividing groove formed in the principal surface on the one side in view in a thickness direction of the mother ceramic substrate.

Also, the mother ceramic substrate according to the present disclosure may preferably include inner conductors in a manner that the individual substrates obtained after the division respectively include the inner conductors.

As described above, when the individual substrates obtained after the division respectively include the inner conductors, a ceramic substrate including therein conductors, such as a circuit and an electrode, can be efficiently manufactured.

Also, a ceramic substrate according to the present disclosure is the individual substrate obtained by dividing the above-described mother ceramic substrate according to the present disclosure along the dividing groove.

Also, on a mother module component according to the present disclosure, surface mount devices are respectively mounted in regions to be the individual substrates after the division of the above-described mother ceramic substrate according to the present disclosure.

Also, a module component according to the present disclosure is obtained by dividing the above-described mother module component according to the present disclosure along the dividing groove of the mother ceramic substrate.

Also, a method of manufacturing a mother ceramic substrate according to the present disclosure is a method of manufacturing the above-described mother ceramic substrate according to the present disclosure.

The method uses a first die having a protruding thread portion on a surface thereof and a second die having a groove portion in a surface thereof at a position at which the groove portion directly faces the protruding thread portion of the first die.

The method includes a step of bringing the surface having the protruding thread portion of the first die into contact with a principal surface on one side of an unfired mother ceramic substrate and bringing the surface having the groove portion of the second die into contact with a principal surface on another side of the unfired mother ceramic substrate, performing press processing with the first die and the second die, hence forming the dividing groove in the principal surface on the one side of the unfired mother ceramic substrate, and forming a protruding thread on the principal surface on the other side at a position corresponding to a position of the dividing groove formed in the principal surface on the one side in view in a thickness direction of the unfired mother ceramic substrate; and a step of firing the unfired mother ceramic substrate having the dividing groove and the protruding thread.

Also, a method of manufacturing another mother ceramic substrate according to the present disclosure is a method of manufacturing the above-described mother ceramic substrate according to the present disclosure.

The method includes a step of performing isostatic press while a surface having a protruding thread portion of a die is in contact with a principal surface on one side of an unfired mother ceramic substrate and an elastic body is in contact with a principal surface on another side of the unfired mother ceramic substrate, forming the dividing groove in the principal surface on the one side of the unfired mother ceramic substrate, and forming a protruding thread on the principal surface on the other side at a position corresponding to a position of the dividing groove formed in the principal surface on the one side in view in a thickness direction of the unfired mother ceramic substrate; and a step of firing the unfired mother ceramic substrate having the dividing groove and the protruding thread.

Also, still another method of manufacturing a mother ceramic substrate according to the present disclosure is a method of manufacturing the above-described mother ceramic substrate according to the present disclosure.

The method includes a step of performing press processing while a surface having a protruding thread portion of a die is in contact with a principal surface on one side of an unfired mother ceramic substrate and a rigid body is arranged at a principal surface on another side of the unfired mother ceramic substrate with an elastic body interposed therebetween, forming the dividing groove in the principal surface on the one side of the unfired mother ceramic substrate, and forming a protruding thread on the principal surface on the other side at a position corresponding to a position of the dividing groove formed in the principal surface on the one side in view in a thickness direction of the unfired mother ceramic substrate; and a step of firing the unfired mother ceramic substrate having the dividing groove and the protruding thread.

Also, yet another method of manufacturing a mother ceramic substrate according to the present disclosure is a method of manufacturing the above-described mother ceramic substrate according to the present disclosure.

The method includes a step of bringing a surface having a groove portion of a die into contact with a principal surface on one side of an unfired mother ceramic substrate, performing press processing, and hence forming a protruding thread on the principal surface on the one side of the unfired mother ceramic substrate; a step of performing processing to form the dividing groove in a principal surface on another side of the unfired mother ceramic substrate at a position corresponding to a position of the protruding thread formed on the principal surface on the one side in view in a thickness direction of the unfired mother ceramic substrate; and a step of firing the unfired mother ceramic substrate having the dividing groove and the protruding thread.

Also, a ceramic substrate according to the present disclosure has a square plane shape, and a principal surface on one side and a principal surface on another side.

At least one side of four sides of the principal surface on the other side has a protruding thread.

A ridge portion of a side of four sides of the principal surface on the one side at a position corresponding to a position of the protruding thread formed on the principal surface on the other side is chamfered in view in a thickness direction of the ceramic substrate.

In the mother ceramic substrate according to the present disclosure, the dividing groove that defines the division position is formed in the principal surface on the one side, and the protruding thread is formed on the principal surface on the other side at the position corresponding to the position of the dividing groove formed in the principal surface on the one side in view in the thickness direction of the mother ceramic substrate. Accordingly, the following advantageous effects are attained.

At the division along the dividing groove, the division can be performed substantially perpendicularly to the principal surfaces of the mother ceramic substrate.

When the mother ceramic substrate is divided, a force that curves the mother ceramic substrate is applied so that the dividing groove formed in the principal surface on the one side serves as the start point of break.

At this time, the stress can be concentrated on a bottom edge of the protruding thread (a mountain portion) formed on the principal surface on the other side. As the result, when the mother ceramic substrate is divided, a crack that advances from the dividing groove in the principal surface on the one side is guided to the bottom edge of the protruding thread (the mountain portion) at the opposite position on the principal surface on the other side.

Since the protruding thread has a smaller width than the thickness of the mother ceramic substrate, as shown in FIG. 5B, a divided end surface 31a of a mother ceramic substrate 1 (also serving as an end surface of a ceramic substrate after division) divided by extension of a crack C is substantially perpendicular to principal surfaces of the mother ceramic substrate.

In the mother ceramic substrate according to the present disclosure, since the dividing groove is formed in the principal surface on the one side and the protruding thread is provided on the principal surface on the other side, even if the dividing groove has a depth of about several micrometers, and the protruding thread has a height of several micrometers (that is, without depending on the depth of the dividing groove), the mother ceramic substrate can be assuredly divided (broken) substantially perpendicularly to the principal surfaces of the mother ceramic substrate.

Also, since the depth of the dividing groove can be small, when the mother ceramic substrate is handled before firing, the mother ceramic substrate can be prevented from being unintentionally divided.

Also, even when the mother ceramic substrate is used for a ceramic substrate (a ferrite individual substrate) as a ferrite sheet used for an electromagnetic-wave blocking and absorbing member for blocking and absorbing an electromagnetic wave, or an antenna device of RFID or NFC, since divided end surfaces are perpendicular, generation of dust particles due to generation of ferrite powder (powdering) because the end surfaces of the individual ferrite substrates rub against each other when handled in a collective state after division may not occur.

Also, for example, when the principal surface on the other side having the protruding thread is attached to a holding film (an adhesive tape) and used, the protruding thread bites into the holding film as an anchor. Accordingly, the divided ferrite individual substrate is prevented from falling when the holding film is bent, and reliability can be increased.

Also, the ceramic substrate according to the present disclosure is the individual substrate (the ceramic substrate) obtained by dividing the above-described mother ceramic substrate according to the present disclosure along the dividing groove. The divided end surfaces are perpendicular to the principal surfaces of the mother ceramic substrate (=the principal surfaces of the individual ceramic substrate), has high form accuracy, and can be widely used for various purposes.

Also, on the mother module component according to the present disclosure, the surface mount devices are respectively mounted in the regions to be the individual substrates after the division of the above-described mother ceramic substrate according to the present disclosure. Accordingly, a module component with high reliability can be easily and assuredly obtained merely by the division along the dividing groove.

Also, the method of manufacturing the mother ceramic substrate according to the present disclosure uses the first die having the protruding thread portion on the surface thereof and the second die having the groove portion in the surface thereof at the position at which the groove portion directly faces the protruding thread portion of the first die, brings the surface having the protruding thread portion of the first die into contact with the principal surface on the one side of the unfired mother ceramic substrate and brings the surface having the groove portion of the second die into contact with the principal surface on the other side of the unfired mother ceramic substrate, and performs the press processing with the first die and the second die. Accordingly, the unfired mother ceramic substrate having the dividing groove formed in the principal surface on the one side, and the protruding thread formed in the principal surface on the other side at the position corresponding to the position of the dividing groove can be assuredly manufactured.

Then, by firing the unfired mother ceramic substrate, the sintered mother ceramic substrate having the dividing groove in the principal surface on the one side, and the protruding thread on the principal surface on the other side can be efficiently and assuredly manufactured.

Also, like another method of manufacturing the mother ceramic substrate according to the present disclosure, even when the isostatic press is performed while the surface having the protruding thread portion of the die is in contact with the principal surface on the one side of the unfired mother ceramic substrate and the elastic body is in contact with the principal surface on the other side of the unfired mother ceramic substrate, the unfired mother ceramic substrate having the dividing groove formed in the principal surface on the one side, and the protruding thread formed in the principal surface on the other side at the position corresponding to the position of the dividing groove can be assuredly manufactured. By firing the mother ceramic substrate, the sintered mother ceramic substrate having the dividing groove in the principal surface on the one side and the protruding thread on the principal surface on the other side can be efficiently and assuredly manufactured.

The protruding thread is formed in the principal surface on the other side at the position corresponding to the position of the dividing groove because the dividing groove is formed in the principal surface on the one side by the pressure applied from the protruding thread portion of the die to the mother ceramic substrate, the force is transmitted to the principal surface on the other side, and the protruding thread portion is formed accordingly.

Also, like still another method of manufacturing the mother ceramic substrate according to the present disclosure, even when the press processing is performed while the surface having the protruding thread portion of the die is in contact with the principal surface on the one side of the unfired mother ceramic substrate and the rigid body is arranged at the principal surface on the other side of the unfired mother ceramic substrate with the elastic body interposed therebetween, the unfired mother ceramic substrate having the dividing groove formed in the principal surface on the one side, and the protruding thread formed in the principal surface on the other side at the position corresponding to the position of the dividing groove can be assuredly manufactured. By firing the mother ceramic substrate, the sintered mother ceramic substrate having the dividing groove in the principal surface on the one side and the protruding thread on the principal surface on the other side can be efficiently and assuredly manufactured.

Also, like yet another manufacturing method of the mother ceramic substrate according to the present disclosure, even when the surface having the groove portion of the die is brought into contact with the principal surface on the one side of the unfired mother ceramic substrate, the press processing is performed, hence the protruding thread is formed on the principal surface on the one side of the unfired mother ceramic substrate, and then the processing (groove forming processing) (for example, cutting processing) to form the dividing groove in the principal surface on the other side is performed, the unfired mother ceramic substrate having the dividing groove formed in the principal surface on the one side, and the protruding thread formed in the principal surface on the other side at the position corresponding to the position of the dividing groove can be assuredly manufactured. By firing the unfired mother ceramic substrate, the sintered mother ceramic substrate having the dividing groove in the principal surface on the one side and the protruding thread on the principal surface on the other side can be efficiently and assuredly manufactured.

In the present disclosure, the dividing groove and the protruding thread may each preferably have a V-like shape (an inverted V-like shape); however, may have another shape such as a U-like shape (an inverted U-like shape).

BRIEF DESCRIPTION OF THE SEVERAL VIEWS OF THE DRAWINGS

FIG. 3A is an illustration showing a state in which the first die and the second die are separated from the pressed mother ceramic substrate, and FIG. 3B is a plan view of the pressed mother ceramic substrate, according to the first embodiment of the present disclosure.

DETAILED DESCRIPTION OF THE DISCLOSURE

Features of the present disclosure are described below in further detail by providing embodiments of the present disclosure.

First Embodiment

In a first embodiment, a method of manufacturing a ceramic substrate (a ferrite substrate) using magnetic ceramic as a ceramic material is described.

(1) First, magnetic ceramic powder (in this first embodiment, ferrite powder), binder resin, and an organic solvent were mixed, molten, dispersed, then deaerated, and thus ceramic raw material slurry was fabricated.

Then, the ceramic raw material slurry was formed in a sheet shape by a known method such as a doctor blade method, and dried. Thus, a mother ceramic green sheet with a thickness of 200 μm was fabricated.

The mother ceramic green sheet may be a multilayer body in which a plurality of ceramic green sheets are laminated.

Then, the obtained mother ceramic green sheet was cut to have a predetermined size, and hence a cut mother ceramic green sheet, being an unfired mother ceramic substrate according to the present disclosure, was obtained.

Figure 1:
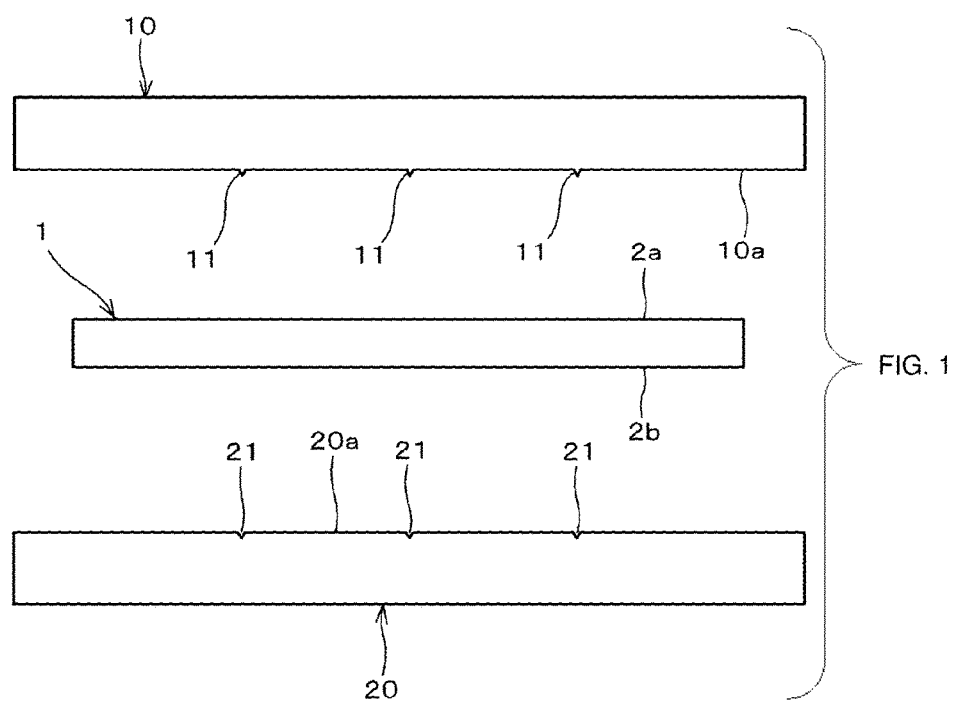
FIG. 1 is an illustration showing a state in which a mother ceramic green sheet (an unfired mother ceramic substrate) is positioned between a first die and a second die according to an embodiment (a first embodiment) of the present disclosure.
Figure 2:
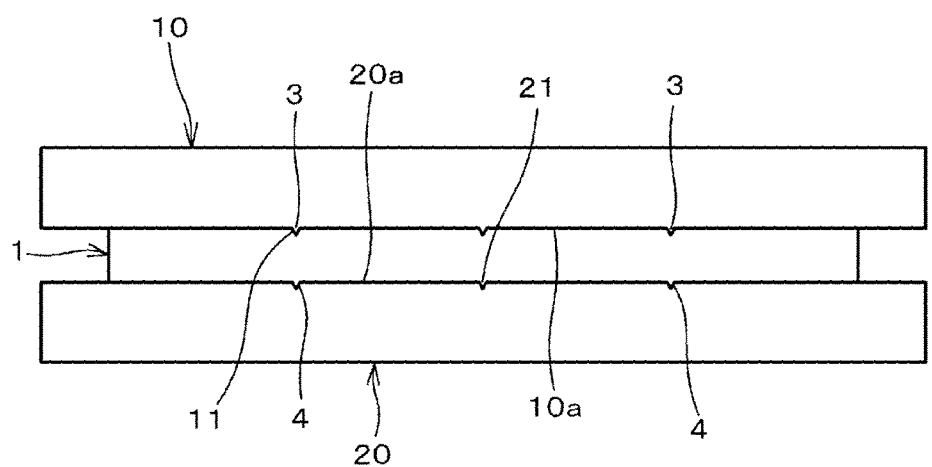
FIG. 2 is an illustration showing a state in which the unfired mother ceramic substrate is pressed with the first die and the second die according to the first embodiment of the present disclosure.

(2) Then, as shown in FIG. 1, a mother ceramic green sheet (an unfired mother ceramic substrate) 1 cut to have a predetermined size was positioned between a first die 10 having protruding thread portions 11 formed on a surface 10a and a second die 20 having groove portions 21 formed in a surface 20a, and was pressed with the first die 10 and the second die 20 as shown in FIG. 2. Accordingly, a pressed mother ceramic substrate (1A) (FIGS. 3A and 3B) having dividing grooves 3 formed in a principal surface 2a on one side and protruding threads 4 formed on a principal surface 2b on another side was obtained.

Figure 4A:
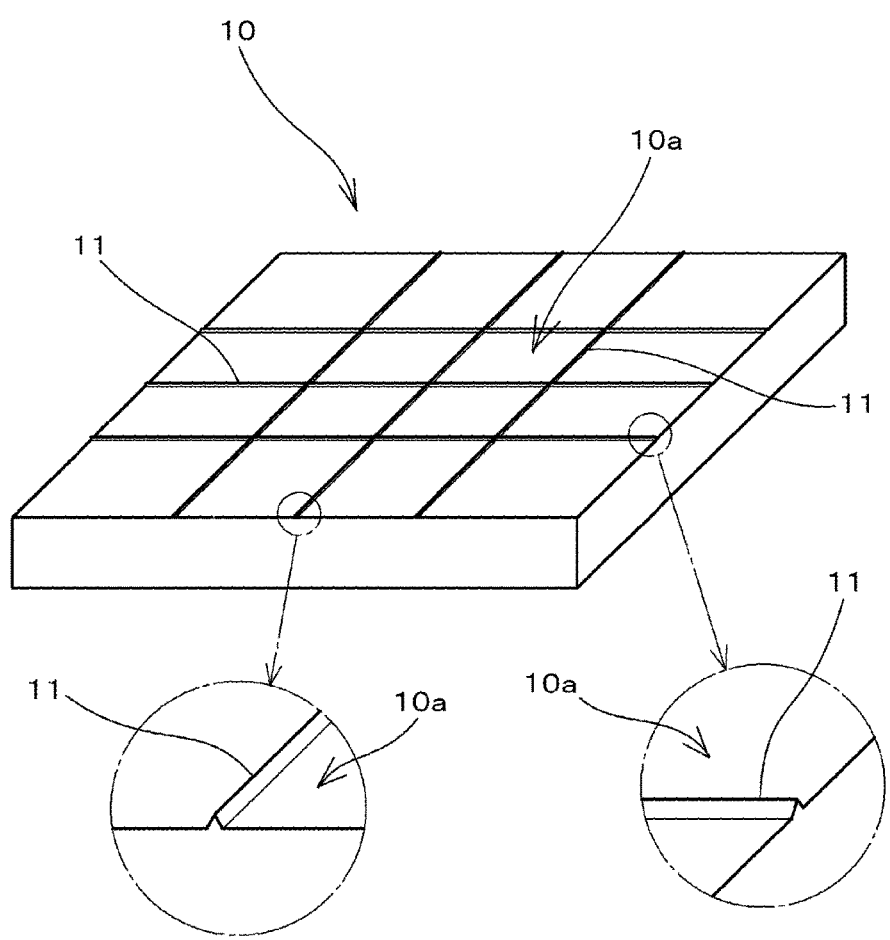
FIG. 4A is an illustration showing the first die used in the first embodiment of the present disclosure.

In this embodiment, as shown in FIG. 4A, the first die 10 having a structure was used in which mountain-shaped protruding thread portions 11 having a height of about 5 μm and a width of about 20 μm were formed in a grid pattern on the surface 10a.

Figure 4B:
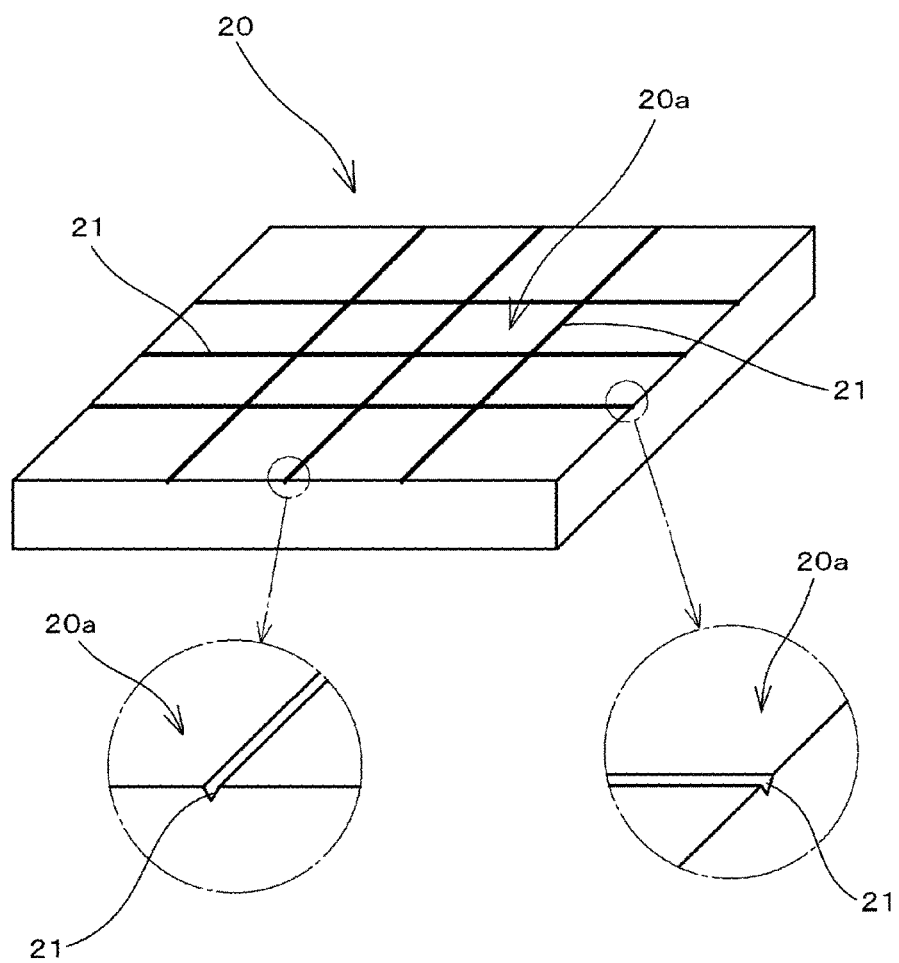
FIG. 4B is an illustration showing the second die used in the first embodiment of the present disclosure.

Also, as shown in FIG. 4B, the second die 20 having a structure was used in which V-shaped groove portions 21 having a depth of about 5 μm and a width of about 20 μm were formed in a grid pattern in the surface 20a.

At press with the first die 10 and the second die 20, the positional relationship between the first die 10 and the second die 20 was adjusted (see FIG. 2) and provided press so that the V-shaped groove portions 21 formed in the surface 20a of the second die 20 were located at the positions corresponding to the positions of the protruding thread portions 11 formed on the surface 10a of the first die 10 in view in a thickness direction of the mother ceramic substrate 1.

(3) Then, the pressed mother ceramic substrate 1 (1A) was fired at 950° C., and hence a sintered mother ceramic substrate (a ferrite sintered substrate) 1 (1B) was obtained.

(4) Then, the sintered mother ceramic substrate 1 (1B) was divided by a method, for example, roller break, and hence was divided along the dividing grooves 3.

Figure 5A:
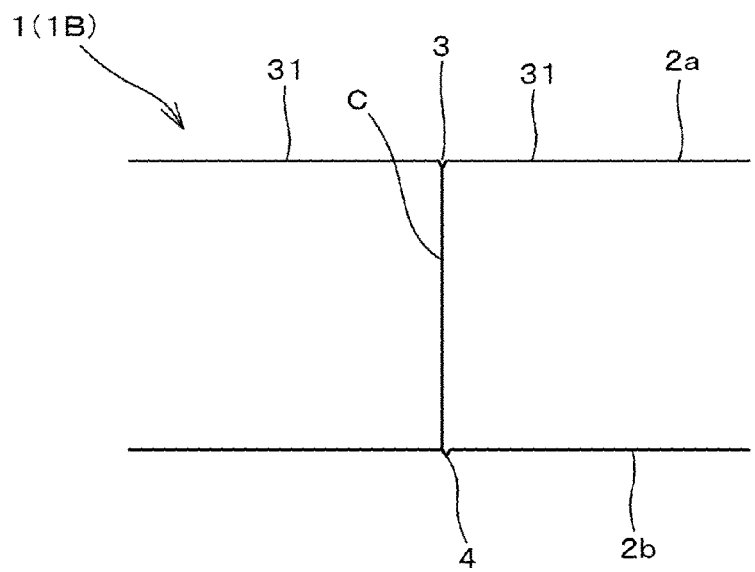
FIG. 5A is an illustration explaining a mechanism in which the mother ceramic substrate is divided along a dividing groove and in a manner that divided end surfaces are perpendicular to principal surfaces.

At this time, as shown in FIG. 5A, a crack C generated at each of the dividing grooves 3 in the principal surface 2a on the one side extends to a bottom edge of the corresponding protruding thread 4 on the principal surface 2b on the other side.

The width of the protruding thread 4 is smaller than the thickness of the mother ceramic substrate 1 (1B), and hence a divided end surface 31a of a ceramic substrate 31 obtained after the crack C extends and the mother ceramic substrate 1 (1B) is divided is substantially perpendicular to the principal surfaces of the ceramic substrate 31 (=the principal surface 2a on the one side and the principal surface 2b on the other side of the mother ceramic green sheet).

Figure 5B:
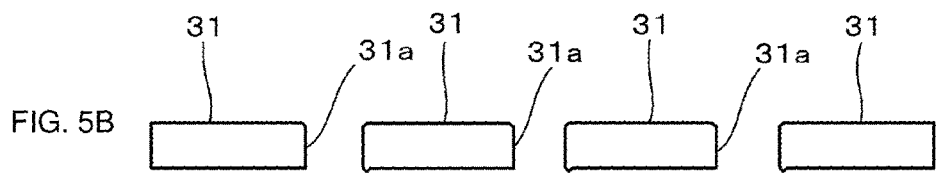
FIG. 5B is an illustration showing a state in which the mother ceramic substrate is divided into individual ceramic substrates, according to the first embodiment of the present disclosure.

As the result, by dividing the mother ceramic substrate 1 (1B) along the dividing grooves 3, the ceramic substrates 31 each having the divided end surface 31a being substantially perpendicular to the principal surfaces of the ceramic substrate (=the principal surface 2a on the one side and the principal surface 2b on the other side of the mother ceramic green sheet) are obtained (see FIG. 5B).

At this time, left and right ridge portions at the principal surface on the one side (the upper surface) of the ceramic substrate 31 shown in FIG. 5B have chamfered shapes formed because the dividing groove 3a (FIG. 5A) is divided at the deepest portion. Also, the protruding thread 4 is present at an end portion on one side of the principal surface on the other side (the lower surface) (in FIG. 5B, an end portion on the left side). The protruding thread 4 is present at only the end portion on the one side (in FIG. 5B, the end portion on the left side) because the crack C generated at the dividing groove 3 in the principal surface 2a on the one side extends to the bottom edge of the protruding thread 4 on the principal surface 2b on the other side.

However, if the crack C extends in a manner that the protruding thread 4 is divided into a main portion and a residual portion, a portion of the divided protruding thread 4 may remain at the end portion on the one side and the end portion on the other side of the principal surface on the other side (the lower surface).

In the mother ceramic substrate 1 (1B) of the present disclosure, since the dividing grooves 3 are formed in the principal surface 2a on the one side and the protruding threads 4 are provided on the principal surface 2b on the other side, even if the depth of the dividing grooves 3 and the height of the protruding threads 4 are about several micrometers, the mother ceramic substrate 1 (1B) can be assuredly divided (broken) substantially perpendicularly to the principal surfaces (the principal surface 2a on the one side, the principal surface 2b on the other side) of the mother ceramic substrate 1 (1B).

The ceramic substrates 31 obtained by dividing the mother ceramic substrates 1 (1B) in this way have the divided end surfaces 31a perpendicular to the principal surfaces of the individual ceramic substrates 31, have high form accuracy, and can be widely used for various purposes.

Figure 6A:
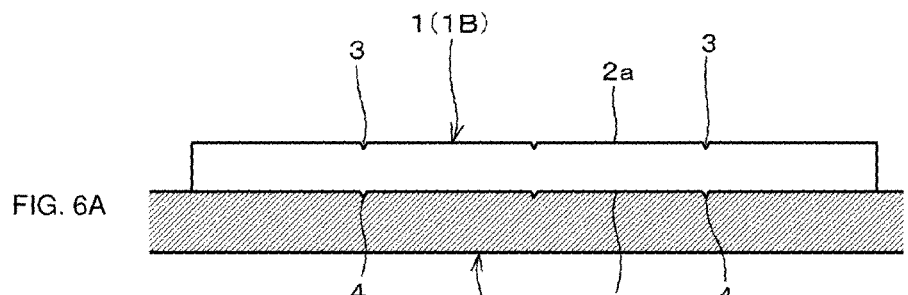
FIG. 6A is an illustration showing a state in which a holding film is attached to a principal surface on another side having protruding threads of a mother ceramic substrate.
Figure 6B:
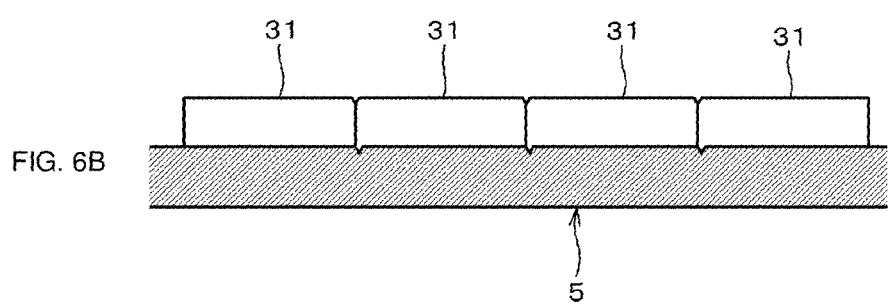
FIG. 6B is an illustration showing a state in which the mother ceramic substrate in the state of FIG. 6A is divided along the dividing grooves.

Also, as shown in FIG. 6A, the sintered mother ceramic substrate 1 (1B) may be divided by a method, for example, roller break, in a state in which, for example, an adhesive tape 5 that functions as a holding film is attached to the principal surface 2b on the other side having the protruding threads 4 of the sintered mother ceramic substrate 1 (1B). The mother ceramic substrate 1 (1B) may be divided along the dividing grooves 3 (FIG. 6B). Then, the adhesive tape 5 may be removed. Accordingly, the ceramic substrates 31 with the divided end surface 31a perpendicular to the principal surfaces may be obtained. Each of such ceramic substrates 31 (individual substrates) may be preferably used as a magnetic ceramic substrate for an antenna device of RFID or NFC.

The ceramic substrates 31 may be used while the adhesive tape 5 functioning as the holding film is not removed and remains as it is attached. In this case, the ceramic substrates 31 that are held on the holding film 5 in a collective state of a plurality of pieces and that can be entirely used as a flexible ferrite sheet, can be obtained. The ceramic substrates 31 serving as the ferrite sheet can be preferably used as an electromagnetic-wave blocking and absorbing member for blocking and absorbing an electromagnetic wave.

Figure 6C:
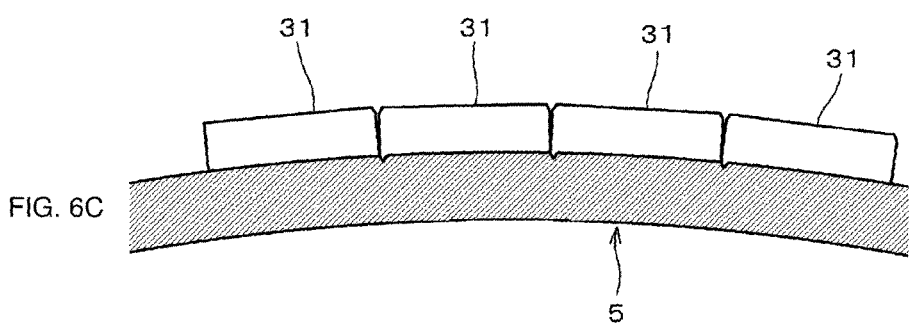
FIG. 6C is an illustration showing a state in which the ceramic substrates held on the holding film and serving as a collective body are curved together with the holding film.

In any of the aforementioned cases, the ceramic substrates 31 as the collective body held on the holding film 5 in the collective state of the plurality of pieces may be entirely curved intentionally or unintentionally, or deformed in a spherical shape as shown in FIG. 6C, for example, when handled in the collective state. Even in this case, generation of dust particles due to generation of ferrite powder (powdering) because the end surfaces (the divided end surfaces) of the individual ceramic substrates (the ferrite substrates)

31 rub against each other when the holding film 5 is bent may not occur. Accordingly, the ceramic substrates 31 can be preferably used for the electromagnetic-wave blocking and absorbing member, the antenna device of RFID or NFC, etc.

Second Embodiment

In a second embodiment, a method of manufacturing a ceramic substrate (a multilayer ceramic substrate) using low-temperature sintered ceramic as a ceramic material is described.

(1) First, glass ceramic powder (low-temperature sintered ceramic powder), binder resin, and an organic solvent were mixed, molten, dispersed, then deaerated, and thus ceramic raw material slurry was fabricated.

Then, the ceramic raw material slurry was formed in a sheet shape by a known method such as a doctor blade method, and dried. Thus, a plurality of mother ceramic green sheets each of which has a thickness of 50 μm were fabricated.

Then, the obtained mother ceramic green sheets were cut to have a predetermined size, a conductive paste (an Ag paste) for forming an inner electrode was applied to each of the mother ceramic green sheets by screen printing, and hence an inner electrode pattern was formed.

The mother ceramic green sheets may include a via conductor (a kind of inner electrode) by forming a through hole in the mother ceramic green sheets and filling the through hole with a conductive paste in case of necessity.

Figure 7:
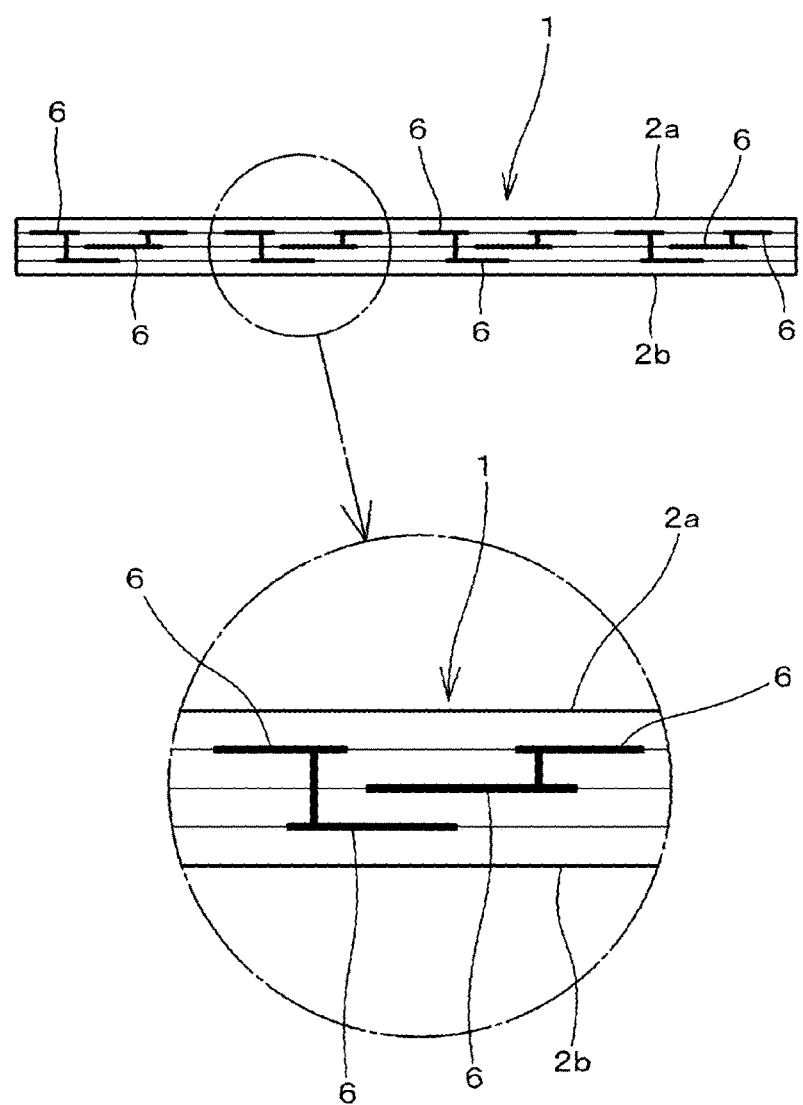
FIG. 7 is a cross-sectional view showing a mother ceramic substrate including inner electrodes manufactured according to a second embodiment of the present disclosure.

Then, by laminating the mother ceramic green sheets with this inner electrode patterns in a predetermined order, as shown in FIG. 7, an unfired mother ceramic substrate (a multilayer body of mother ceramic green sheets) 1 including inner electrodes 6 was obtained.

Figure 8:
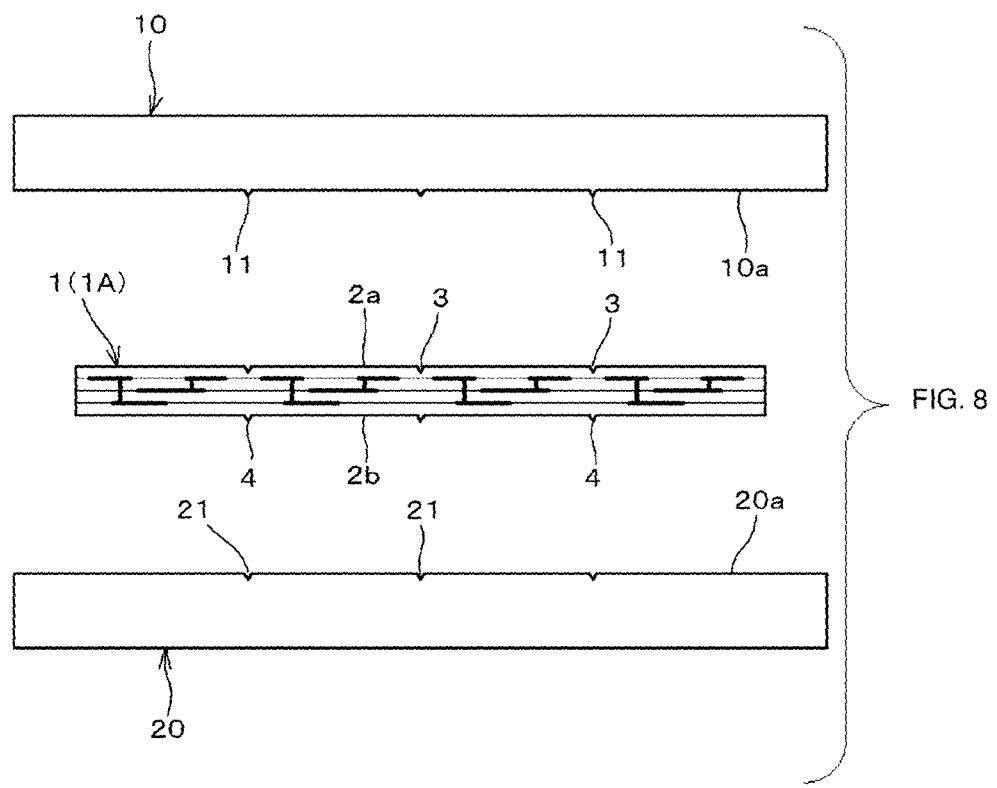
FIG. 8 is an illustration showing a state in which a first die and a second die are separated from a pressed mother ceramic substrate according to another embodiment (a second embodiment) of the present disclosure.

(2) Then, the mother ceramic substrate 1 was pressed by using the same dies and the same method as those of the first embodiment. Accordingly, as shown in FIG. 8, a pressed mother ceramic substrate 1 (1A) (FIGS. 3A and 3B) having dividing grooves 3 formed in a principal surface 2a on one side and protruding threads 4 formed on a principal surface 2b on another side was obtained. FIG. 8 shows a state in which the first die 10 and the second die 20 are separated from the mother ceramic substrate 1 (1A) after press.

(3) Then, the pressed mother ceramic substrate 1 (1A) was fired at 900° C., and hence a sintered mother ceramic substrate 1 (1B) was obtained.

(4) Then, the sintered mother ceramic substrate 1 (1B) was divided by a method, for example, roller break, and hence was divided along the dividing grooves 3. Accordingly, individual ceramic substrates (multilayer ceramic substrates) 31 as shown in FIG. 9 were obtained.

Figure 9:
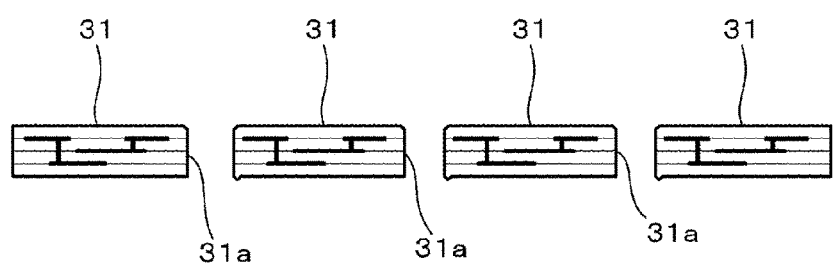
FIG. 9 is an illustration showing a state in which the mother ceramic substrate is divided into individual ceramic substrates according to the second embodiment.

The ceramic substrates (the multilayer ceramic substrates) 31 obtained by dividing the mother ceramic substrate 1 (1B) have divided end surfaces (end surfaces of the ceramic substrates 31) 31a perpendicular to the principal surfaces of the individual ceramic substrates 31 as shown in FIG. 9, have high form accuracy, and can be widely used for various purposes.

Third Embodiment

Figure 10:
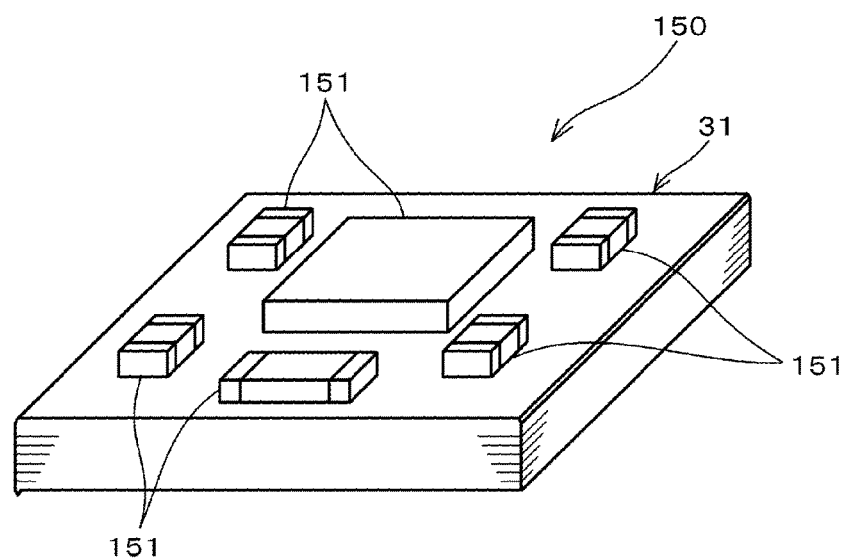
FIG. 10 is a perspective view showing a configuration of a module component manufactured by a method of manufacturing a module component according to the third embodiment of the present disclosure.

In a third embodiment, as shown in FIG. 10, a method of manufacturing a module component 150 on which surface mount devices 151 are mounted on a ceramic substrate (a multilayer ceramic substrate) 1 including, for example, a surface conductor, an inner conductor, and a via conductor, is described.

Figure 11:
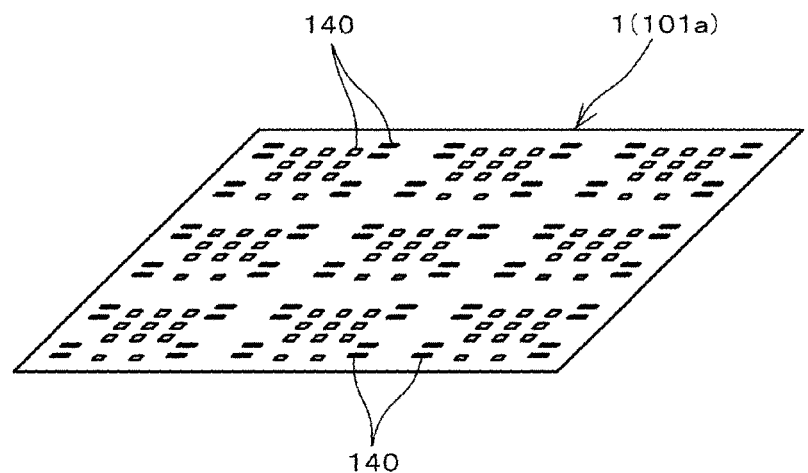
FIG. 11 is a perspective view showing a pattern forming sheet in which a conductive pattern is arranged on a ceramic green sheet, according to the third embodiment of the present disclosure.

(1) First, a ceramic green sheet (a low-temperature sintered ceramic green sheet) 1 was fabricated by a method similar to that of the second embodiment. Conductive patterns serving as, for example, a surface conductor and an inner conductor were formed and a via hole was formed in the obtained ceramic green sheet 1. The via hole was filled with a conductive material to be a via conductor. Thus, pattern forming sheets 101a each including required conductive patterns 140 were fabricated as shown in FIG. 11.

Figure 12:
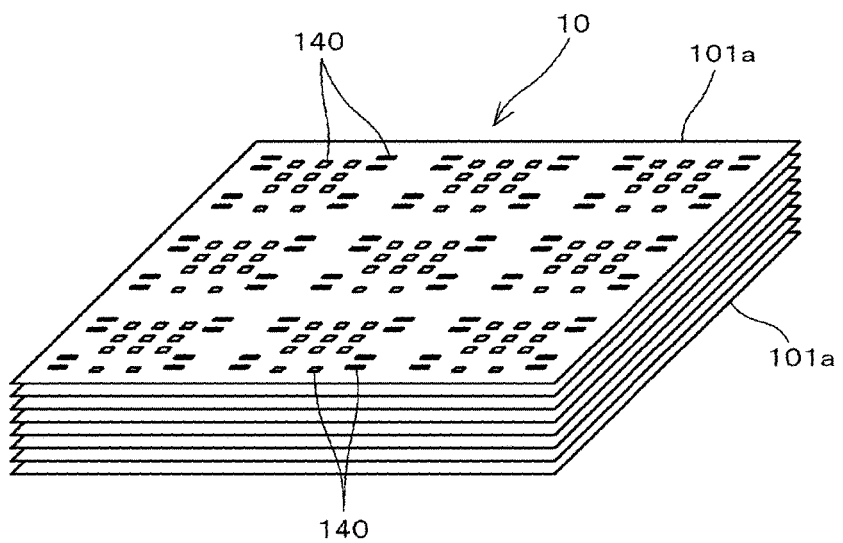
FIG. 12 is a perspective view showing a state in which pattern forming sheets in FIG. 11 are laminated in a predetermined order.
Figure 13:
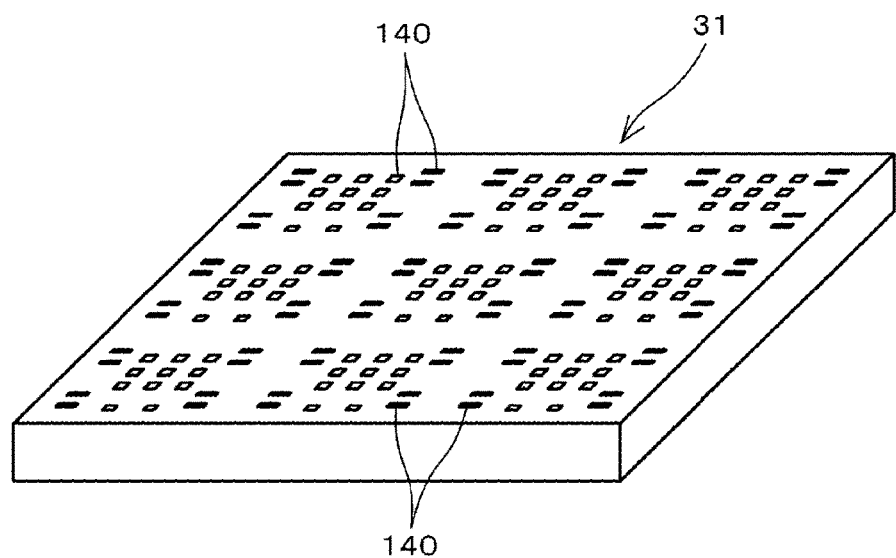
FIG. 13 is a perspective view showing a multilayer body (an unfired mother ceramic substrate) obtained by pressing a multilayer body in which the pattern forming sheets are laminated in FIG. 12.

(2) Then, the pattern forming sheets 101a including the conductive patterns 140 were laminated in a predetermined order (FIG. 12). The obtained multilayer body was put in a bag, deaerated, then hermetically sealed, heated to a predetermined temperature, then applied with isostatic press. Accordingly, as shown in FIG. 13, a multilayer body (an unfired mother ceramic substrate) 1 in which the respective pattern forming sheets 101a were pressed was obtained.

Figure 14:
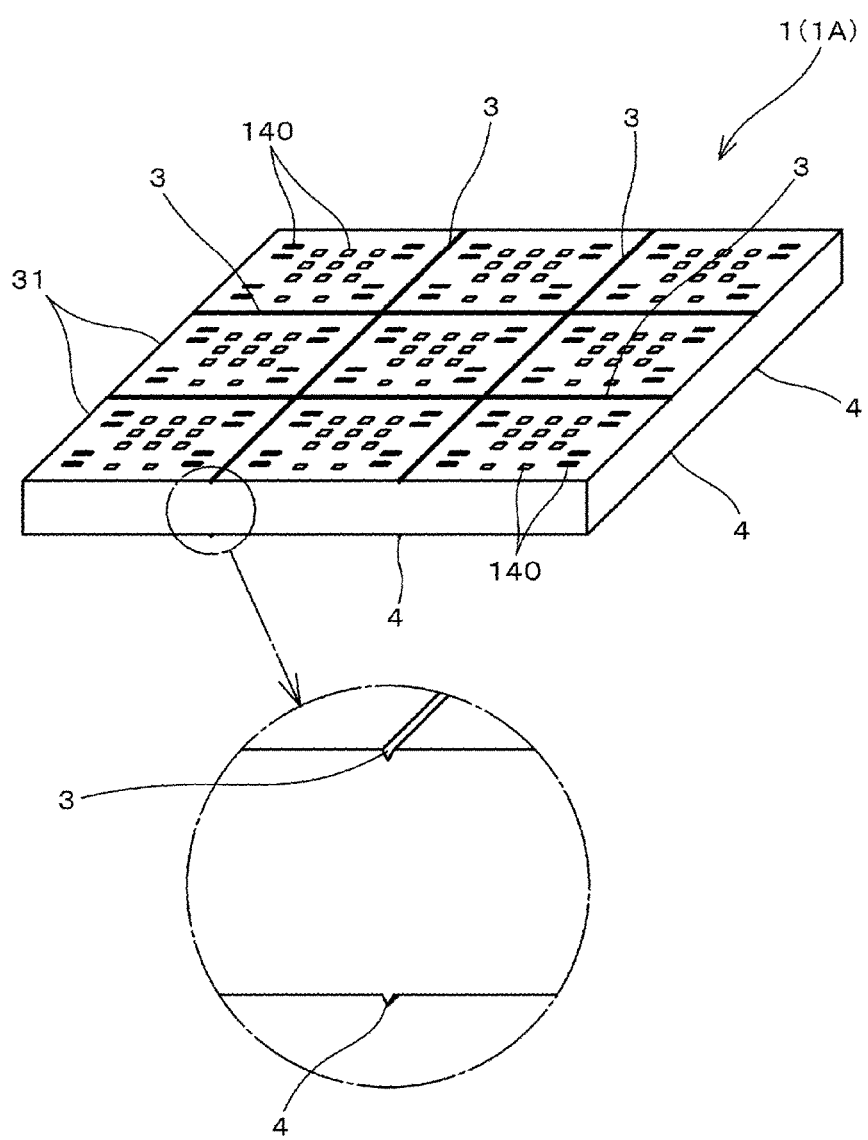
FIG. 14 is a perspective view showing a state in which the unfired mother ceramic substrate in FIG. 13 is pressed with the first die and the second die, dividing grooves are formed on a principal surface on one side, and protruding threads are formed on a principal surface on another side.

(3) Then, as shown in FIG. 14, the unfired mother ceramic substrate 1 was pressed by using the same dies and the same method as those of the first and second embodiments. Accordingly, a pressed mother ceramic substrate 1 (1A) having dividing grooves 3 formed in a principal surface 2a on one side and protruding threads 4 formed on a principal surface 2b on another side was obtained.

(4) Then, the pressed mother ceramic substrate 1 (1A) was fired at 900° C., and hence a sintered mother ceramic substrate 1 (1B) was obtained.

Figure 15:
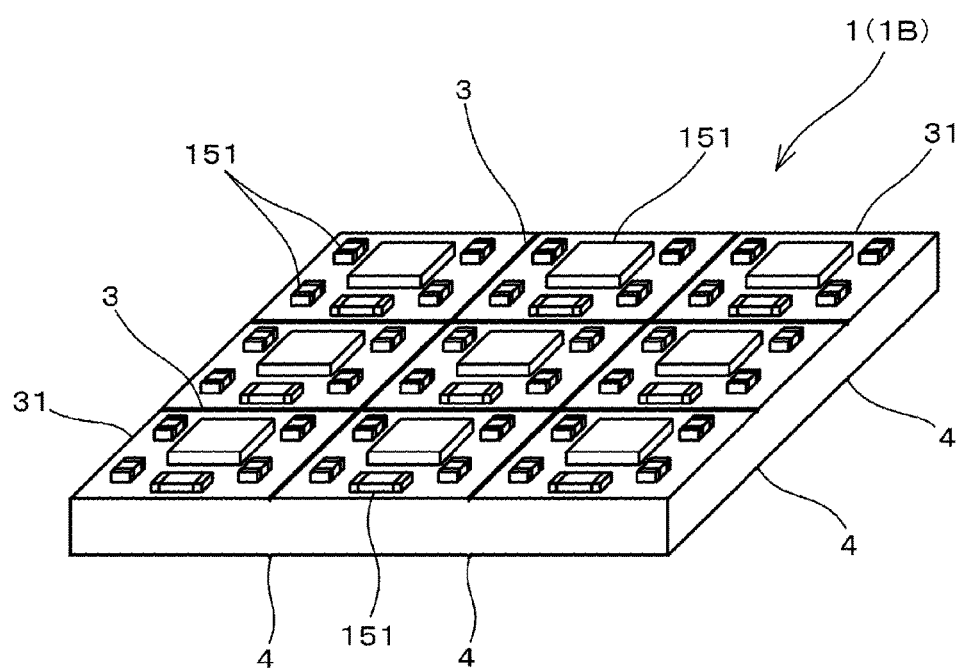
FIG. 15 is a perspective view showing a state in which surface mount devices are mounted on the mother ceramic substrate having the dividing grooves in the principal surface on the one side and the protruding threads on the principal surface on the other side.

(5) Then, surface mount devices 151 were mounted on each region to be an individual ceramic substrate 31 after firing of the sintered mother ceramic substrate 1 (1B) (FIG. 15).

As the surface mount devices 151, for example, IC chips, multilayer ceramic capacitors, chip inductors, chip resistances are mounted.

Figure 16:
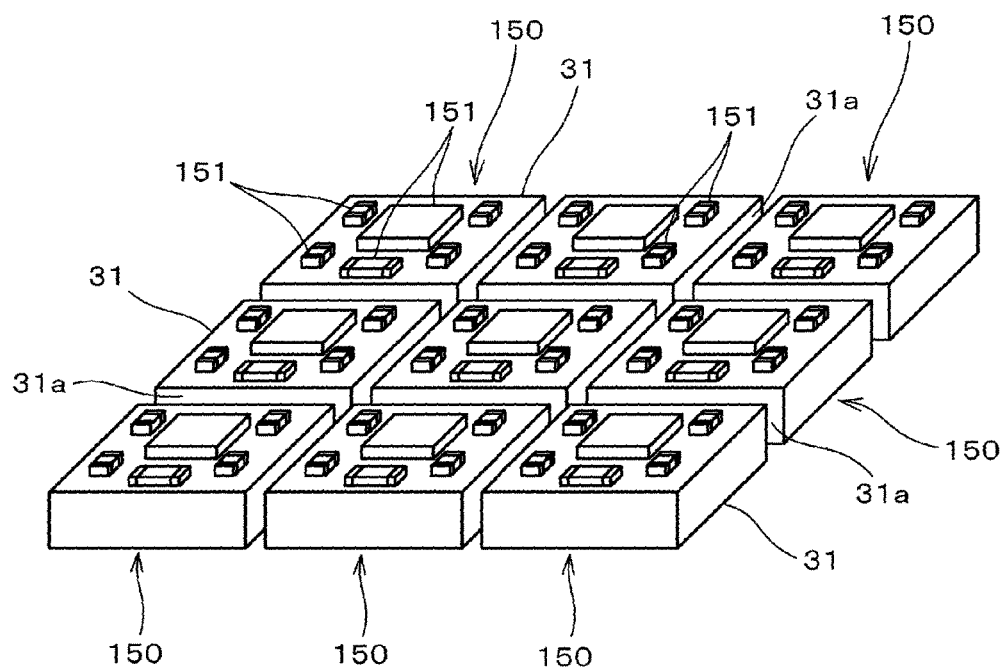
FIG. 16 is a perspective view schematically showing a state in which the fired mother ceramic substrate is broken and divided into individual module components.

(6) Then, the mother ceramic substrate 1 (1B) with the surface mount devices 151 mounted on each ceramic substrate was divided along the dividing grooves 3 (FIG. 16). Accordingly, individual module components 150 each having divided end surfaces 31a perpendicular to the principal surfaces thereof, having high dimensional accuracy and high form accuracy, and having the surface mount devices 151 mounted on each ceramic substrate (each multilayer ceramic substrate) 31 thereof are obtained.

Even in the case of the ceramic substrates (the multilayer ceramic substrates) 31 shown in FIG. 16, left and right ridge portions at the principal surface on the one side (the upper surface) have chamfered shapes formed because the dividing groove 3a (see FIG. 5A) is divided at the deepest portion (see FIG. 5B). Also, the protruding thread 4 is present at an end portion on one side (in FIG. 5B, an end portion on the left side) of the principal surface on the other side (the lower surface). However, in FIG. 16, the illustration of the chamfered shapes of the ridge portions or the protruding threads on the principal surface on the other side (the lower surface) is omitted.

Also, in the third embodiment, the module component on which the surface mount electronic devices are mounted on the multilayer ceramic substrate has been exemplarily described; however, the present disclosure may be applied to a case in which surface mount electronic devices are mounted on a single-layer ceramic substrate.

With the method of the third embodiment, a module component on which surface mount devices are mounted on a ceramic substrate with high dimensional accuracy and high form accuracy can be efficiently manufactured.

Fourth Embodiment

In the first, second, and third embodiments, the dividing grooves are formed in the principal surface on the one side of the mother ceramic substrate and the protruding threads are formed on the principal surface on the other side of the mother ceramic substrate by using the first die having the protruding thread portions and the second die having the groove portions. Also, even with the method described below, the dividing grooves may be formed in the principal surface on the one side of the mother ceramic substrate and the protruding threads may be formed on the principal surface on the other side of the mother ceramic substrate.

(1) First Other Method for Forming Grooves and Protruding Threads

Figure 17:
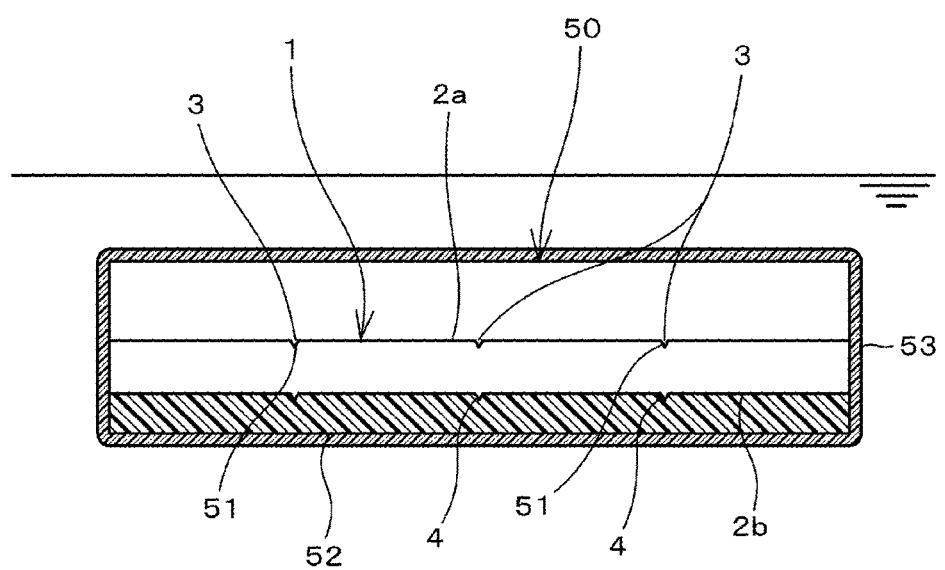
FIG. 17 is an illustration showing a first other method for forming grooves and protruding threads according to the present disclosure.

As schematically shown in FIG. 17, the entirety is housed in a bag-shaped member 53 while a surface having protruding thread portions 51 of a die 50 is in contact with a principal surface 2a on one side of an unfired mother ceramic substrate 1 and an elastic body 52 for isostatic press is in contact with a principal surface 2b on another side of the unfired mother ceramic substrate 1, and isostatic press, i.e., applying a pressure in water is performed. Accordingly, with the press force with the protruding thread portions 51, dividing grooves 3 are formed at positions corresponding to the protruding thread portions 51 on the principal surface 2a on the one side of the unfired mother ceramic substrate 1, and protruding threads 4 are formed on the principal surface 2b on the other side of the unfired mother ceramic substrate 1.

The bag-shaped member 53 may also function as the elastic body 52 for isostatic press, and hence isostatic press may be executed without using the elastic body 52 for isostatic press. The specific method of isostatic press is not particularly limited.

Even with this method, a mother ceramic substrate 1 having a dividing groove 3 that defines a division position formed in a principal surface 2a on one side of an unfired mother ceramic substrate 1, and having a protruding thread 4 on a principal surface 2b on another side at a position corresponding to a position of the dividing groove 3 in the principal surface 2a on the one side in view in a thickness direction of the unfired mother ceramic substrate 1, can be formed.

(2) Second Other Method for Forming Grooves and Protruding Threads

Figure 18:
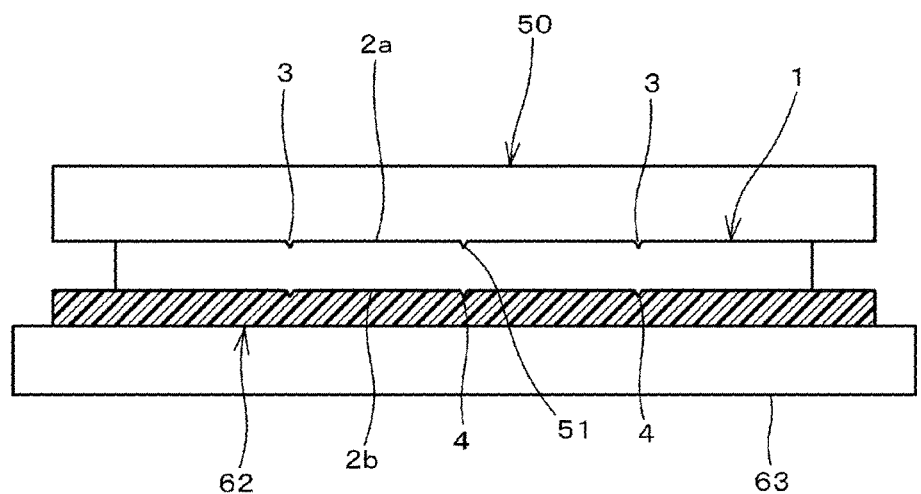
FIG. 18 is an illustration showing a second other method for forming grooves and protruding threads according to the present disclosure.

As schematically shown in FIG. 18, press processing is performed while a surface having protruding thread portions 51 of a die 50 is in contact with a principal surface 2a on one side of an unfired mother ceramic substrate 1 and a rigid body 63 is arranged at a principal surface 2b on another side of the unfired mother ceramic substrate 1 with an elastic body 62 interposed therebetween.

Even with this method, a mother ceramic substrate 1 having a dividing groove 3 that defines a division position formed in a principal surface 2a on one side of an unfired mother ceramic substrate 1, and having a protruding thread 4 on a principal surface 2b on another side at a position corresponding to a position of the dividing groove 3 in the principal surface 2a on the one side in view in a thickness direction of the unfired mother ceramic substrate 1, can be formed.

Figure 19:
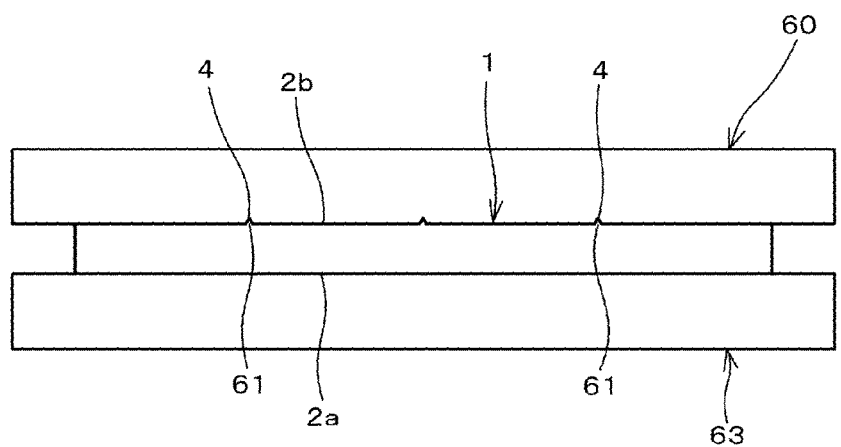
FIG. 19 is an illustration showing a step of a third other method for forming grooves and protruding threads according to the present disclosure.
Figure 20:
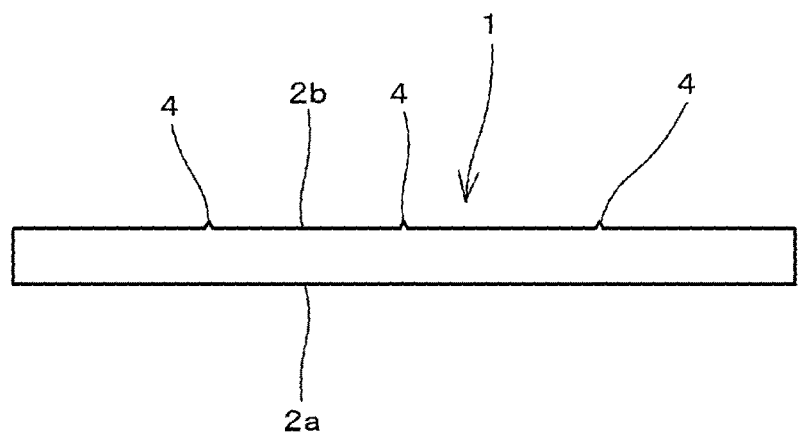
FIG. 20 is an illustration showing a state in which protruding threads are formed on a principal surface on one side of a mother ceramic substrate according to the third other method for forming the grooves and the protruding threads according to the present disclosure.

(3) Third Other Method for Forming Grooves and Protruding Threads (3) As schematically shown in FIG. 19, a surface having groove portions 61 of a die 60 is brought into contact with a principal surface 2b on another side of an unfired mother ceramic substrate 1 placed on a flat rigid body 63, and press processing is performed. Accordingly, as shown in FIG. 20, protruding threads 4 are formed on the principal surface 2b on the other side of the unfired mother ceramic substrate 1.

Figure 21:
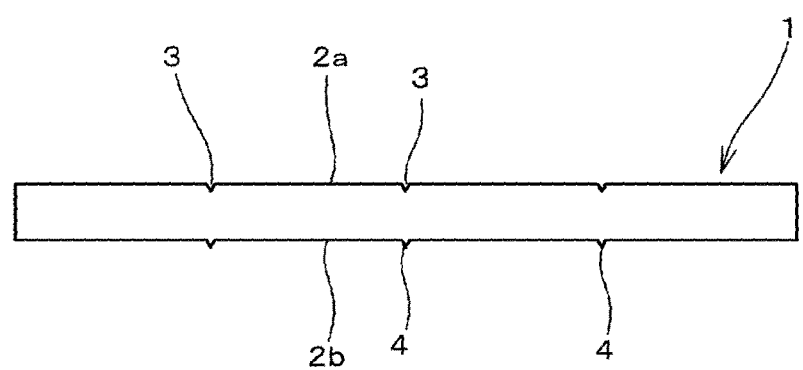
FIG. 21 is an illustration showing a state in which dividing grooves are formed on a principal surface on another side of the mother ceramic substrate according to the third other method for forming the grooves and the protruding threads according to the present disclosure.
Figure 22A:
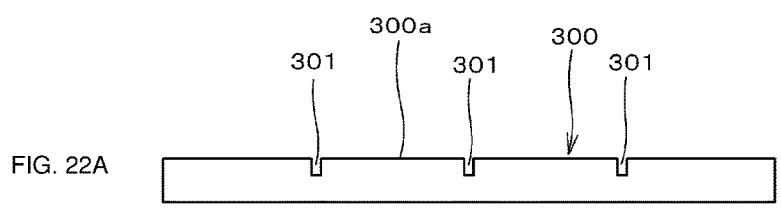
FIG. 22A is a front view showing a method of dividing a mother substrate of related art.
Figure 22B:
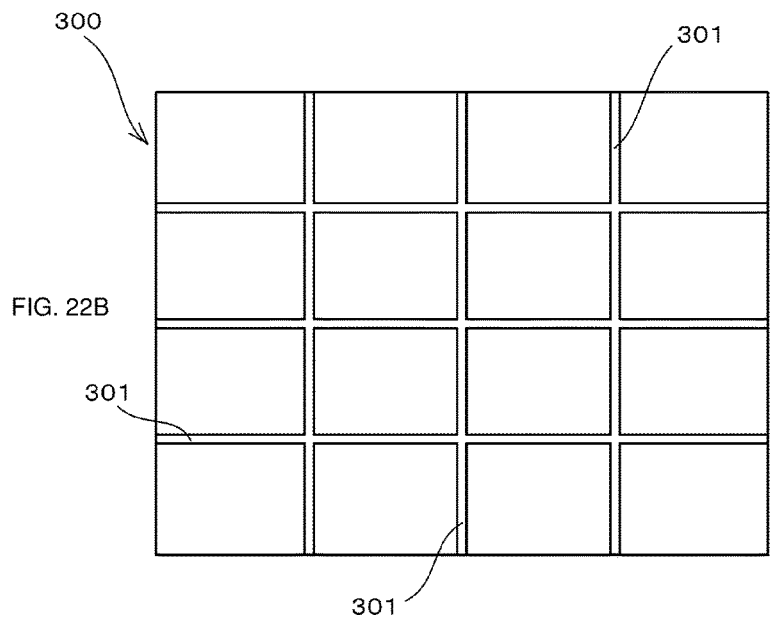
FIG. 22B is a plan view.
Figure 23:
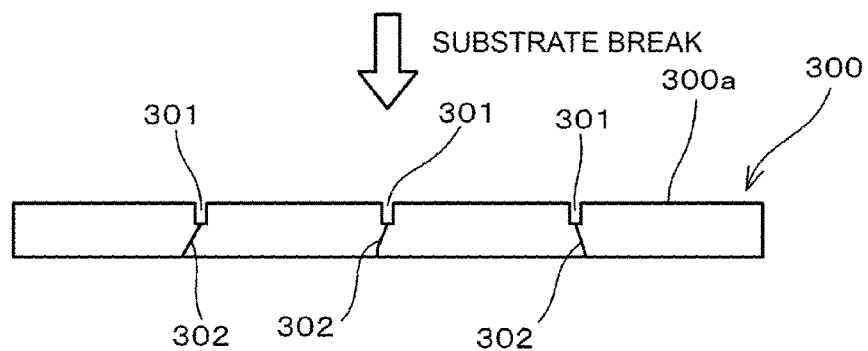
FIG. 23 is an illustration showing a problem of the method of dividing the mother substrate of related art.

Then, as shown in FIG. 21, groove forming processing is performed on a principal surface 2a on one side of the unfired mother ceramic substrate 1. Accordingly, dividing grooves 3 are formed in the principal surface 2a on the one side of the unfired mother ceramic substrate 1, at the positions corresponding to the positions of the protruding threads 4 formed on the principal surface 2b on the other side in view in the thickness direction of the unfired mother ceramic substrate 1.

As the groove forming processing, a method, such as cutting processing or laser processing, can be applied.

Even with this method, a mother ceramic substrate 1 having a dividing groove 3 that defines a division position formed in a principal surface 2a on one side of an unfired mother ceramic substrate 1, and having a protruding thread 4 on a principal surface 2b on another side at a position corresponding to a position of the dividing groove 3 in the principal surface 2a on the one side in view in a thickness direction of the unfired mother ceramic substrate 1, can be formed.

Also, in the above-described embodiments, the dividing grooves and the protruding threads have V-like shapes (inverted V-like shapes). However, the dividing grooves and the protruding threads may have other shapes such as U-like shapes (inverted U-like shapes).

The present disclosure is not limited to the above-described embodiments, and various applications and modifications can be applied within the scope of the disclosure, for the dimension and shape of a ceramic substrate to be manufactured, the method of forming grooves and protruding threads on an unfired mother ceramic substrate in a manufacturing step, the type of a device used for the manufacturing step, a method of breaking a sintered mother ceramic substrate, and so forth.

1 mother ceramic substrate
     (1A) mother ceramic substrate including dividing groove and protruding thread
     (1B) sintered mother ceramic substrate
   2a principal surface on one side of mother ceramic substrate
   2b principal surface on another side
   3 dividing groove
   4 protruding thread
   5 adhesive tape (holding film)
   6 inner electrode
   10 first die
   10a surface of first die
   11 protruding thread portion
   20 second die
   20a surface of second die
   21 groove portion
   31 ceramic substrate
   31a divided end surface (end surface of ceramic substrate)
   50 die
   51 protruding thread portion
   52 elastic body for isostatic press
   53 bag-shaped member
   60 die
   61 groove portion
   62 elastic body
   63 rigid body
   101a pattern forming sheet
   140 conductive pattern
   150 module component
   151 surface mount device
   C crack

The invention claimed is:

1. A mother ceramic substrate dividable at a predetermined position and separated into a plurality of individual substrates, the mother ceramic substrate comprising:
   a dividing groove defining a division position formed in one principal surface, and
   a protruding thread formed on another principal surface and protruding integrally with the mother ceramic substrate from a position corresponding to a position of the dividing groove formed in the one principal surface in viewing in a thickness direction of the mother ceramic substrate.

2. The mother ceramic substrate according to claim 1, further comprising inner conductors in such a manner that the individual substrates obtained after dividing the mother ceramic substrate respectively include the inner conductors.

3. A ceramic substrate comprising the individual substrate obtained by dividing the mother ceramic substrate according to claim 1 along the dividing groove.

4. A mother module component comprising surface mount devices respectively mounted in regions where the individual substrates are located after dividing the mother ceramic substrate according to claim 1.

5. A module component obtained by dividing the mother module component according to claim 4 along the dividing groove of the mother ceramic substrate.

6. A method of manufacturing the mother ceramic substrate according to claim 1, comprising:
   providing a first die having a protruding thread portion on a surface of the first die and a second die having a groove portion in a surface of the second die at a position at which the groove portion directly faces the protruding thread portion of the first die;
   bringing the surface of the first die having the protruding thread portion into contact with one principal surface of an unfired mother ceramic substrate and bringing the surface of the second die having the groove portion into contact with another principal surface of the unfired mother ceramic substrate;
   performing press processing on the first die and the second die to form the dividing groove in the one principal surface of the unfired mother ceramic substrate, and to form a protruding thread on the another principal surface of the unfired mother ceramic substrate at a position corresponding to a position of the dividing groove formed in the one principal surface of the unfired mother ceramic substrate in viewing in a thickness direction of the unfired mother ceramic substrate; and
   firing the unfired mother ceramic substrate having the dividing groove and the protruding thread.

7. A method of manufacturing the mother ceramic substrate according to claim 1, comprising:
   performing isostatic press while a surface of a die having a protruding thread portion is in contact with one principal surface of an unfired mother ceramic substrate and an elastic body is in contact with another principal surface of the unfired mother ceramic substrate to form the dividing groove in the one principal surface of the unfired mother ceramic substrate, and to form a protruding thread on the another principal surface of the unfired mother ceramic substrate at a position corresponding to a position of the dividing groove formed in the one principal surface of the unfired mother ceramic substrate in viewing in a thickness direction of the unfired mother ceramic substrate; and
   firing the unfired mother ceramic substrate having the dividing groove and the protruding thread.

8. A method of manufacturing the mother ceramic substrate according to claim 1, comprising:
   performing press processing while a surface of a die having a protruding thread portion is in contact with one principal surface of an unfired mother ceramic substrate and a rigid body is arranged at another principal surface of the unfired mother ceramic substrate with an elastic body interposed between the unfired mother ceramic substrate and the rigid body to form the dividing groove in the one principal surface of the unfired mother ceramic substrate, and to form a protruding thread on the another principal surface of the unfired mother ceramic substrate at a position corresponding to a position of the dividing groove formed in the one principal surface of the unfired mother ceramic substrate in viewing in a thickness direction of the unfired mother ceramic substrate; and
   firing the unfired mother ceramic substrate having the dividing groove and the protruding thread.

9. A method of manufacturing the mother ceramic substrate according to claim 1, comprising:
   bringing a surface of a die having a groove portion into contact with one principal surface of an unfired mother ceramic substrate;
   performing press processing on the die and the unfired mother ceramic substrate to form a protruding thread on the one principal surface of the unfired mother ceramic substrate;
   performing processing on the die and the unfired mother ceramic substrate to form the dividing groove in the another principal surface of the unfired mother ceramic substrate at a position corresponding to a position of the protruding thread formed on the one principal surface of the unfired mother ceramic substrate in viewing in a thickness direction of the unfired mother ceramic substrate; and
   firing the unfired mother ceramic substrate having the dividing groove and the protruding thread.

10. A ceramic substrate comprising the individual substrate obtained by dividing the mother ceramic substrate according to claim 2 along the dividing groove.

11. A mother module component comprising surface mount devices respectively mounted in regions where the individual substrates are located after dividing the mother ceramic substrate according to claim 2.

12. A method of manufacturing the mother ceramic substrate according to claim 2, comprising:
   providing a first die having a protruding thread portion on a surface of the first die and a second die having a groove portion in a surface of the second die at a position at which the groove portion directly faces the protruding thread portion of the first die;
   bringing the surface of the first die having the protruding thread portion into contact with one principal surface of an unfired mother ceramic substrate and bringing the surface of the second die having the groove portion into contact with another principal surface of the unfired mother ceramic substrate;
   performing press processing on the first die and the second die to form the dividing groove in the one principal surface of the unfired mother ceramic substrate, and to form a protruding thread on the another principal surface of the unfired mother ceramic substrate at a position corresponding to a position of the dividing groove formed in the one principal surface of the unfired mother ceramic substrate in viewing in a thickness direction of the unfired mother ceramic substrate; and firing the unfired mother ceramic substrate having the dividing groove and the protruding thread.

13. A method of manufacturing the mother ceramic substrate according to claim 2, comprising:

performing isostatic press while a surface of a die having a protruding thread portion is in contact with one principal surface of an unfired mother ceramic substrate and an elastic body is in contact with another principal surface of the unfired mother ceramic substrate to form the dividing groove in the one principal surface of the unfired mother ceramic substrate, and to form a protruding thread on the another principal surface of the unfired mother ceramic substrate at a position corresponding to a position of the dividing groove formed in the one principal surface of the unfired mother ceramic substrate in viewing in a thickness direction of the unfired mother ceramic substrate; and firing the unfired mother ceramic substrate having the dividing groove and the protruding thread.

14. A method of manufacturing the mother ceramic substrate according to claim 2, comprising:

performing press processing while a surface of a die having a protruding thread portion is in contact with one principal surface of an unfired mother ceramic substrate and a rigid body is arranged at another principal surface of the unfired mother ceramic substrate with an elastic body interposed between the unfired mother ceramic substrate and the rigid body to form the dividing groove in the one principal surface of the unfired mother ceramic substrate, and to form a protruding thread on the another principal surface of the unfired mother ceramic substrate at a position corresponding to a position of the dividing groove formed in the one principal surface of the unfired mother ceramic substrate in viewing in a thickness direction of the unfired mother ceramic substrate; and firing the unfired mother ceramic substrate having the dividing groove and the protruding thread.

15. A method of manufacturing the mother ceramic substrate according to claim 2, comprising:

bringing a surface of a die having a groove portion into contact with one principal surface of an unfired mother ceramic substrate;

performing press processing on the die and the unfired mother ceramic substrate to form a protruding thread on the one principal surface of the unfired mother ceramic substrate;

performing processing on the die and the unfired mother ceramic substrate to form the dividing groove in the another principal surface of the unfired mother ceramic substrate at a position corresponding to a position of the protruding thread formed on the one principal surface of the unfired mother ceramic substrate in viewing in a thickness direction of the unfired mother ceramic substrate; and firing the unfired mother ceramic substrate having the dividing groove and the protruding thread.

16. A ceramic substrate having a square plane shape, and one principal surface and another principal surface, wherein at least one side of four sides of the another principal surface has a protruding thread, and wherein a ridge portion of a side of four sides of the one principal surface at a position corresponding to a position of the protruding thread formed on the another principal surface and protruding integrally with the mother ceramic substrate is chamfered in viewing in a thickness direction of the ceramic substrate.

* * * * *

UNITED STATES PATENT AND TRADEMARK OFFICE
CERTIFICATE OF CORRECTION

PATENT NO. : 10,257,927 B2
APPLICATION NO. : 15/358241
DATED : April 9, 2019
INVENTOR(S) : Yukio Maeda et al.

Page 1 of 1

It is certified that error appears in the above-identified patent and that said Letters Patent is hereby corrected as shown below:

In the Specification

Column 9, Line 20, "mother ceramic substrate (1A)" should read --mother ceramic substrate 1 (1A)--

Column 9, Line 65, "strate" should read --strate 31--

Signed and Sealed this
Twenty-ninth Day of September, 2020

Andrei Iancu
*Director of the United States Patent and Trademark Office*